United States Patent
Uematsu

(10) Patent No.: US 10,330,552 B2
(45) Date of Patent: Jun. 25, 2019

(54) PRESSURE SENSOR DEVICE INCLUDING-FLUORINATED GEL PROTECTIVE MEMBER DISPOSED ON A PROTECTIVE FILM

(71) Applicant: FUJI ELECTRIC CO., LTD., Kawasaki-shi (JP)

(72) Inventor: Katsuyuki Uematsu, Hata-machi (JP)

(73) Assignee: FUJI ELECTRIC CO., LTD., Kawasahi-Shi (JP)

( * ) Notice: Subject to any disclaimer, the term of this patent is extended or adjusted under 35 U.S.C. 154(b) by 586 days.

(21) Appl. No.: 14/687,188

(22) Filed: Apr. 15, 2015

(65) Prior Publication Data

US 2015/0219513 A1    Aug. 6, 2015

Related U.S. Application Data

(63) Continuation of application No. PCT/JP2013/080468, filed on Nov. 11, 2013.

(30) Foreign Application Priority Data

Nov. 30, 2012    (JP) .................................. 2012-262107

(51) Int. Cl.
    *G01L 19/00*     (2006.01)
    *G01L 9/00*      (2006.01)
    (Continued)

(52) U.S. Cl.
    CPC ........ *G01L 19/0084* (2013.01); *G01L 9/0052* (2013.01); *G01L 19/0069* (2013.01);
    (Continued)

(58) Field of Classification Search
    CPC ... G01L 19/0627; G01L 19/06; H01L 23/564; H01L 21/563
    See application file for complete search history.

(56) References Cited

U.S. PATENT DOCUMENTS 4,461,180 A * 7/1984 Hellouin de Menibus ..................
................................................................ G01L 19/0618
........................................................................ 73/706
5,210,341 A * 5/1993 Dolbier, Jr. ........... C07C 17/269
........................................................................ 540/144
(Continued)

FOREIGN PATENT DOCUMENTS

CN           1645079 A       7/2005
CN         101145532 A       3/2008
(Continued)

OTHER PUBLICATIONS

Chinese Office Action issued in counterpart application No. CN201380054665.4, dated Jan. 21, 2016. English translation provided.

(Continued)

*Primary Examiner* — Harshad R Patel
*Assistant Examiner* — Tran M. Tran
(74) *Attorney, Agent, or Firm* — Rossi, Kimms & McDowell LLP

(57)    ABSTRACT

In aspects of the invention, a sensor unit is stored in a recessed sensor mount portion formed in a resin case. The sensor unit can be formed so that a semiconductor pressure sensor chip is joined to one side of a glass pedestal, and the other side of the glass pedestal is die-bonded to the bottom of the sensor mount portion through an adhesive. An electrode pad on the semiconductor pressure sensor chip is electrically connected through a bonding wire to a lead terminal for leading externally that pierces through the resin case and is integrally insert-molded therein. An entire surface of the sensor unit, an exposed part of the lead terminal internally-located in the resin case, the bonding wire, and an exposed part of an inner wall of the resin case can be coated (Continued)

with the protective film composed of a poly(p-xylylene)-family polymer including fluorine.

4 Claims, 4 Drawing Sheets

(51) Int. Cl.
| | | |
|---|---|---|
| *G01L 19/06* | (2006.01) | |
| *H05K 13/00* | (2006.01) | |
| *H01L 23/057* | (2006.01) | |
| *H01L 23/00* | (2006.01) | |
| *H01L 23/24* | (2006.01) | |

(52) U.S. Cl.
CPC ........ *G01L 19/0654* (2013.01); *H01L 23/057* (2013.01); *H01L 24/85* (2013.01); *H05K 13/00* (2013.01); *H01L 23/24* (2013.01); *H01L 24/05* (2013.01); *H01L 24/45* (2013.01); *H01L 2224/05124* (2013.01); *H01L 2224/05166* (2013.01); *H01L 2224/05644* (2013.01); *H01L 2224/32225* (2013.01); *H01L 2224/45124* (2013.01); *H01L 2224/45144* (2013.01); *H01L 2224/48091* (2013.01); *H01L 2224/48247* (2013.01); *H01L 2224/48465* (2013.01); *H01L 2224/73265* (2013.01); *H01L 2224/8592* (2013.01); *H01L 2224/85444* (2013.01); *H01L 2924/181* (2013.01); *Y10T 29/49171* (2015.01)

(56) References Cited

U.S. PATENT DOCUMENTS

| | | | | |
|---|---|---|---|---|
| 5,285,690 A * | 2/1994 | Koen | ............... | G01L 9/0042 |
| | | | | 29/621.1 |
| 5,412,992 A * | 5/1995 | Tobita | ............... | G01L 9/065 |
| | | | | 338/4 |
| 5,424,097 A * | 6/1995 | Olson | ............... | B05D 1/60 |
| | | | | 118/708 |
| 5,438,876 A * | 8/1995 | Lewis | ............... | G01L 19/0084 |
| | | | | 73/721 |
| 5,780,928 A * | 7/1998 | Rostoker | ............... | H01L 23/427 |
| | | | | 257/713 |
| 6,140,144 A * | 10/2000 | Najafi | ............... | B81C 1/00269 |
| | | | | 438/106 |
| 6,512,255 B2 * | 1/2003 | Aoki | ............... | G01L 19/141 |
| | | | | 257/254 |
| 6,561,038 B2 * | 5/2003 | Gravel | ............... | G01L 9/0075 |
| | | | | 73/706 |
| 6,710,356 B2 * | 3/2004 | Leblans | ............... | G21K 4/00 |
| | | | | 250/484.4 |
| 6,807,864 B2 * | 10/2004 | Takakuwa | ............... | G01L 19/0038 |
| | | | | 73/700 |
| 6,962,081 B2 * | 11/2005 | Ueyanagi | ............... | G01L 19/0084 |
| | | | | 73/514.18 |
| 7,102,143 B2 * | 9/2006 | Leblans | ............... | C09K 11/7733 |
| | | | | 250/483.1 |
| 7,119,657 B2 * | 10/2006 | Ueyanagi | ............... | H01L 23/522 |
| | | | | 257/E21.004 |
| 7,192,540 B2 * | 3/2007 | Tsunoda | ............... | H01L 21/314 |
| | | | | 252/521.4 |
| 7,216,545 B2 * | 5/2007 | Uchida | ............... | G01L 19/0627 |
| | | | | 73/705 |
| 7,454,976 B2 * | 11/2008 | Wanami | ............... | B60R 21/0136 |
| | | | | 361/283.1 |
| 7,705,448 B2 * | 4/2010 | Andou | ............... | H01L 23/4334 |
| | | | | 257/714 |
| 8,381,387 B2 * | 2/2013 | Matsumoto | ............... | A61B 8/12 |
| | | | | 216/39 |
| 8,671,766 B2 * | 3/2014 | Sterling | ............... | H01L 23/04 |
| | | | | 73/700 |
| 8,674,462 B2 * | 3/2014 | Wombacher | ............... | H01L 23/055 |
| | | | | 257/415 |
| 8,740,800 B2 * | 6/2014 | Wakabayashi | ............... | A61B 8/12 |
| | | | | 310/328 |
| 9,282,630 B2 * | 3/2016 | Merz | ............... | H05K 1/0216 |
| 9,366,593 B2 * | 6/2016 | Vaupel | ............... | B81B 7/0048 |
| 9,379,033 B2 * | 6/2016 | Wombacher | ............... | H01L 23/055 |
| 9,484,508 B2 * | 11/2016 | Dirscherl | ............... | H01L 33/56 |
| 2001/0028072 A1 | 10/2001 | Aoki et al. | | |
| 2004/0021209 A1 | 2/2004 | Shiono et al. | | |
| 2004/0026632 A1 * | 2/2004 | Struye | ............... | G21K 4/00 |
| | | | | 250/484.4 |
| 2005/0034526 A1 * | 2/2005 | Shinyama | ............... | B81B 7/0012 |
| | | | | 73/715 |
| 2005/0155432 A1 | 7/2005 | Katayama | | |
| 2006/0013745 A1 | 1/2006 | Chen | | |
| 2007/0017294 A1 | 1/2007 | Asada et al. | | |
| 2007/0148390 A1 * | 6/2007 | Kumar | ............... | A61L 27/34 |
| | | | | 428/36.91 |
| 2009/0026560 A1 | 1/2009 | Wombacher et al. | | |
| 2009/0146138 A1 | 6/2009 | Aoki | | |
| 2012/0288688 A1 * | 11/2012 | Kug | ............... | G21K 4/00 |
| | | | | 428/177 |
| 2012/0291559 A1 | 11/2012 | Sterling et al. | | |

FOREIGN PATENT DOCUMENTS

| | | |
|---|---|---|
| CN | 101459221 A | 6/2009 |
| CN | 102786025 A | 11/2012 |
| FR | 2798732 A1 | 3/2001 |
| JP | 05223670 A | 8/1993 |
| JP | 06213742 A | 8/1994 |
| JP | 08073569 A | 3/1996 |
| JP | 2001153746 A | 6/2001 |
| JP | 2004251741 A | 9/2004 |
| JP | 2005283587 A | 10/2005 |
| JP | 2007033047 A | 2/2007 |

OTHER PUBLICATIONS

Extended European Search Report issued in European Appln. No. 13859540.0 dated Jun. 1, 2016.
International Search Report issued in PCT/JP2013/080468, dated Dec. 3, 2013. English translation provided.
Office Action issued in Chinese Patent Application No. 201380054665.4 dated Apr. 10, 2017. English translation provided.

* cited by examiner

PRESSURE SENSOR DEVICE INCLUDING-FLUORINATED GEL PROTECTIVE MEMBER DISPOSED ON A PROTECTIVE FILM

CROSS-REFERENCE TO RELATED APPLICATIONS

This application is a continuation of International Application No. PCT/JP2013/080468, filed on Nov. 11, 2013, which is based on and claims priority to Japanese Patent Application No. JP 2012-262107, filed on Nov. 30, 2012. The disclosure of the Japanese priority application and the PCT application in their entirety, including the drawings, claims, and the specification thereof, are incorporated herein by reference.

BACKGOUND OF THE INVENTION

1. Field of the Invention

The present invention relates to a pressure sensor device and a method for manufacturing the pressure sensor device.

2. Related Art

Generally, in a pressure sensor device for automotive use, a semiconductor pressure sensor chip, which utilizes a piezo-resistance effect, is employed as a sensor element. The semiconductor pressure sensor chip has a configuration that a plurality of semiconductor strain gauges made of material having the piezo-resistance effect are connected in a bridge circuit on a diaphragm made of single crystal silicon and the like. In the semiconductor strain gauges, gauge resistance changes in response to an amount of deformation of the diaphragm, which deforms when pressure changes, and then the amount of change is taken out through the bridge circuit as a voltage signal.

FIG. 5 is a sectional view illustrating a configuration of a conventional pressure sensor device. As shown in FIG. 5, the conventional pressure sensor device has a configuration that a sensor unit 110 is stored in a recessed sensor mount portion 102 formed in a resin case 101. The sensor unit 110 is formed by joining a semiconductor pressure sensor chip 111 to one side of a glass pedestal 112, and the other side of the glass pedestal 112 is die-bonded through an adhesive 113 on the bottom portion of the sensor mount portion 102.

The semiconductor pressure sensor chip 111 is electrically connected through a bonding wire 104 to a lead terminal (lead frame) 103 for leading externally that pierces through the resin case 101 and is integrally insert-molded therein. A gel protective member 105 is filled up internally in the resin case 101. A fluoro-gel, a fluorosilicone gel, a silicone gel, and the like, which are soft so as to propagate pressure to the semiconductor pressure sensor chip 111 and have excellent chemical resistance, are employed for the gel protective member 105.

The semiconductor pressure sensor chip 111, an exposed part of the lead terminal 103 internally-located in the resin case 101, and the bonding wire 104 are buried in the gel protective member 105 and then protected by the gel protective member 105 from adhesion of pollutant and the like included in a pressure medium to be measured. A space portion, which is located at the side where the gel protective member 105 is disposed in the resin case 101, corresponds to a pressure detector. The pressure medium to be measured contacts a surface of the gel protective member 105, and pressure is applied to the semiconductor pressure sensor chip 111.

In recent years, in order to purify automobile exhaust gas, the pressure sensor device described above is employed not only for an engine intake system but also for exhaust systems such as an exhaust gas recirculation (EGR) system that recirculates a part of exhaust gas to the intake system to improve fuel efficiency and the like. Then the pressure sensor device requires fuel resistance, chemical resistance, and corrosion resistance against corrosive substances included in the exhaust gas.

As a pressure sensor device for which the chemical resistance and the corrosion resistance are improved, there is provided devices that a semiconductor pressure sensor chip, an exposed part of the lead terminal internally-located in the resin case, and a bonding wire are protected with a silicone gel, a fluorinated gel, and a poly (p-xylylene) resin (for example, see Japanese Patent Application Publication Nos. H5-223670, JP-A H6-213742, JP-A 2004-251741, JP-A H8-073569. In JP-A H8-073569, a method that is able to coat a narrow space portion is provided, and humidity resistance is also confirmed by a pressure cooker test.

Further, as a pressure sensor device that responsiveness is improved, there is provided such a device that a chip, a pin, and a wire are coated and protected by a protective member made of a fluoro-gel having electrical insulation properties and flexibility, wherein the protective member made of the fluoro-gel has a saturation swelling percentage of 7 wt. % or less when dipped in gasoline, and then this prevents air bubbles from appearing when chemicals and the like dissolved in the protective member vaporize (for example, see Japanese Patent Application Publication No. JP-A 2001-153746).

In the conventional art described above, however, water, corrosive substances, and precursors of the corrosive substances, which exist in gaseous state in exhaust gas, penetrate into a gel protective member, reach to a semiconductor pressure sensor chip, a lead terminal, and a bonding wire and cause failures owing to corrosion as confirmed by the inventor. Moreover, intake pressure of an engine intake system ranges from 10 to 300 kPa, but exhaust pressure of an exhaust system ranges from 300 to 600 kPa. Then pressure measured by a pressure sensor device is higher for the exhaust system than for the intake system. Therefore, water and the corrosive substances such as nitrogen oxides, and sulfur oxides, which are included in a pressure medium to be measured, are easily pressed into the inside of the gel protective member of the pressure sensor device in the exhaust system.

Nitric acid is generated from a nitrogen oxide, and sulfuric acid is generated from a sulfur oxide when the nitrogen oxide and the sulfur oxide have penetrated into the gel protective member. Then, nitric acid and sulfuric acid generated in the inside of the gel protective member cause the semiconductor pressure sensor, the lead terminal, and the bonding wire to corrode, resulting in failures. Furthermore, as the exhaust gas has a high temperature, corrosion reactions are easily accelerated under the circumstances. Thus this might promote to shorten a life of the pressure sensor device. Moreover, it is confirmed that poly (phenylenesulfide) (PPS) constituting a resin case isn't tolerant of sulfuric acid produced and concentrated in the inside of the gel protective member. If the resin case is corroded and dissolved, the pressure sensor might lose airtightness. As described above, circumstances that the exhaust system is mounted are harsh in comparison with those of the intake system, and then there is a problem that the structure of the conventional pressure sensor device for the intake system, in which the gel protective member only is sufficient for measure against corrosion, causes the semiconductor pressure sensor, the lead terminal, the bonding wire, and the resin case to corrode under circumstances exposed by fuel, chemicals, and the corrosive substances, resulting in deterioration of reliability.

SUMMARY OF THE INVENTION

In order to solve the problems according to the conventional art described above, it is an object of the present invention to provide a highly reliable pressure sensor device and a method for manufacturing the pressure sensor device.

In order to solve the problems described above and to achieve the object of the present invention, according to an aspect of the invention, there is provided a pressure sensor device comprising a sensor chip for converting pressure to an electric signal; a resin case for storing the sensor chip; a signal terminal for taking out externally the electrical signal output from the sensor chip, wherein one end of the signal terminal is exposed at the inside of the resin case and connected to the sensor chip through a wire; and a protective film composed of a poly(p-xylylene)-family polymer including fluorine, wherein the protective film coats an electrode pad of the sensor chip, an exposed part of the signal terminal internally-located in the resin case, the wire, and an inner wall of the resin case.

Further, in the pressure sensor device according to the above aspect of the invention, the protective film coats an entire surface of the sensor chip, the exposed part of the signal terminal internally-located in the resin case, the wire, and an exposed part of the inner wall of the resin case.

Furthermore, in the pressure sensor device according to the above aspect of the invention, the protective film is coated with a protective member composed of a fluorinated gel.

Moreover, in the pressure sensor device according to the above aspect of the invention, the protective member is filled up internally in the resin case, and the sensor chip, the exposed part of the signal terminal internally-located in the resin case, and the wire are buried in the protective member.

Further, in the pressure sensor device according to the above aspect of the invention, the sensor chip is a semiconductor sensor chip.

Further, in order to solve the problems described above and to achieve the object of the present invention, according to an aspect of the invention, there is provided a method for manufacturing a pressure sensor device, wherein the pressure sensor device comprises a sensor chip for converting pressure to an electric signal, a resin case for storing the sensor chip, a signal terminal for taking out externally the electric signal output from the sensor chip, wherein one end of the signal terminal is exposed at the inside of the resin case, and connected to the sensor chip through a wire, comprising the steps of storing, firstly, the sensor chip to the resin case; next, connecting the sensor chip to the signal terminal through the wire; next, coating an electrode pad of the sensor chip, an exposed part of the signal terminal internally-located in the resin case, the wire, and an inner wall of the resin case with a protective film composed of a poly(p-xylylene)-family polymer including fluorine.

Furthermore, in the method for manufacturing the pressure sensor device according to the above aspect of the invention, in the coating step, monomer molecules included in a gas that the poly(p-xylylene)-family polymers including fluorine vaporize are vapor-deposited to form the protective film at normal temperature in reduced pressure atmosphere.

Moreover, in the method for manufacturing the pressure sensor device according to the above aspect of the invention, in the coating step, the protective film coats an entire surface of the sensor chip, the exposed part of the signal terminal internally-located in the resin case, the wire, and an exposed part of the inner wall of the resin case.

Further, in the method for manufacturing the pressure sensor device according to the above aspect of the invention, after the coating step is completed, the protective member composed of the fluorinated gel is filled up internally in the resin case, and wherein the sensor chip, the exposed part of the signal terminal internally-located in the resin case, and the wire are buried in the protective member.

Furthermore, in the method for manufacturing the pressure sensor device according to the above aspect of the invention, after the coating step is completed and before the protective member is filled up, the method comprises a step of performing a modifying treatment on the protective film to improve wettability to the protective member disposed at the surface of the protective film.

Moreover, in the method for manufacturing the pressure sensor device according to the above aspect of the invention, the sensor chip is a semiconductor sensor chip.

According to the above aspect of the invention, coating the entire surface of each constituent part internally-located in the resin case and an exposed part of the inside wall of the resin case with the protective film composed of the poly(p-xylylene)-family polymer including fluorine can prevent each constituent part internally-located in the resin case and the inside wall of the resin case from contacting a pressure medium to be measured. Then this can protect each constituent part internally-located in the resin case and the exposed part of the inside wall of the resin case against steam or acid vapor included in a pressure medium to be measured. And then this can prevent each constituent part internally-located in the resin case and the inside wall of the resin case from corroding.

According to the above aspect of the invention, coating the surface of the protective film further with the protective member can prevent mechanical and physical damage and breakage such as wire disconnection caused by contacting manufacturing equipment in manufacturing process and damage that the sensor chip suffers from foreign matter incoming during actual use after mounted on vehicle. Further, according to the above aspect of the invention, coating the surface of the protective film further with the protective member can control responsiveness deterioration and sensing characteristics fluctuation for the pressure sensor device, wherein the responsiveness deterioration and the sensing characteristics fluctuation are caused by soot and water in exhaust gas that deposit, coagulate, and stick on the sensor chip during actual use after mounted on vehicle.

Furthermore, according to the above aspect of the invention, forming the protective film composed of the poly(p-xylylene)-family polymer including fluorine by vapor deposition allows polymer molecules to migrate into gaps between the inner wall of the resin case and each of the sensor chip, a signal terminal, and a wire. Then this permits the protective film to coat each constituent part internally-located in the resin case and an exposed part of the inside wall of the resin case without leaving any space. Thus this can protect each constituent part internally-located in the resin case and the inside wall of the resin case against steam and acid vapor included in the pressure medium to be measured.

According to a pressure sensor device and a method for manufacturing the pressure sensor device, there is an advantage that reliability can be improved.

DETAILED DESCRIPTION

Figure 1A:
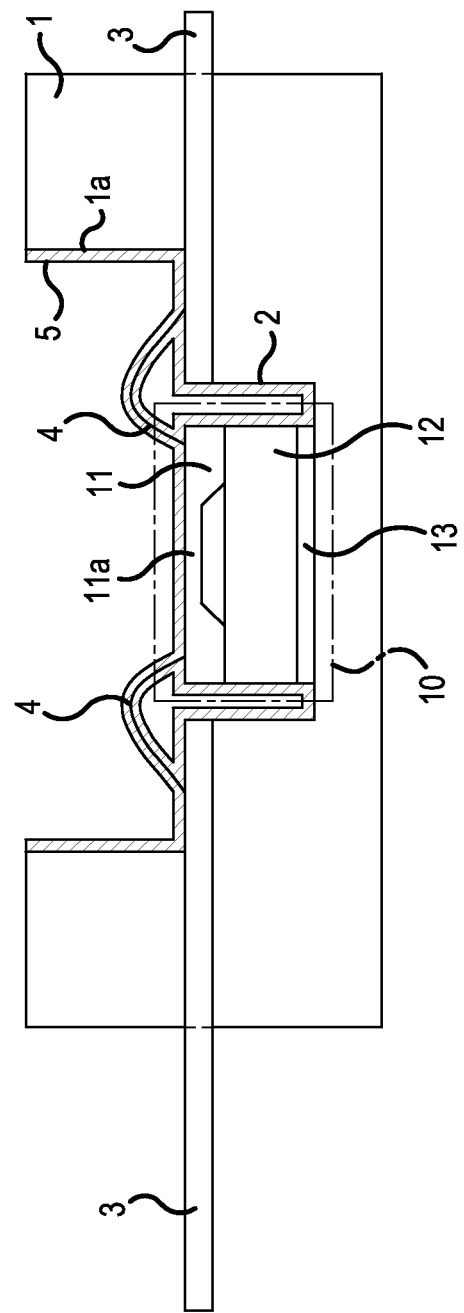
FIG. 1A is a sectional view illustrating a configuration of a pressure sensor device according to a first embodiment.

Referring to attached figures in the following, a preferred embodiment of a pressure sensor device and a method for manufacturing the pressure sensor device according to the present invention will be described in detail. In addition, according to the description of the embodiments and the attached figures, the same reference numerals will be given to identical constituent elements, and redundant descriptions will not be provided.

First Embodiment

Figure 1B:
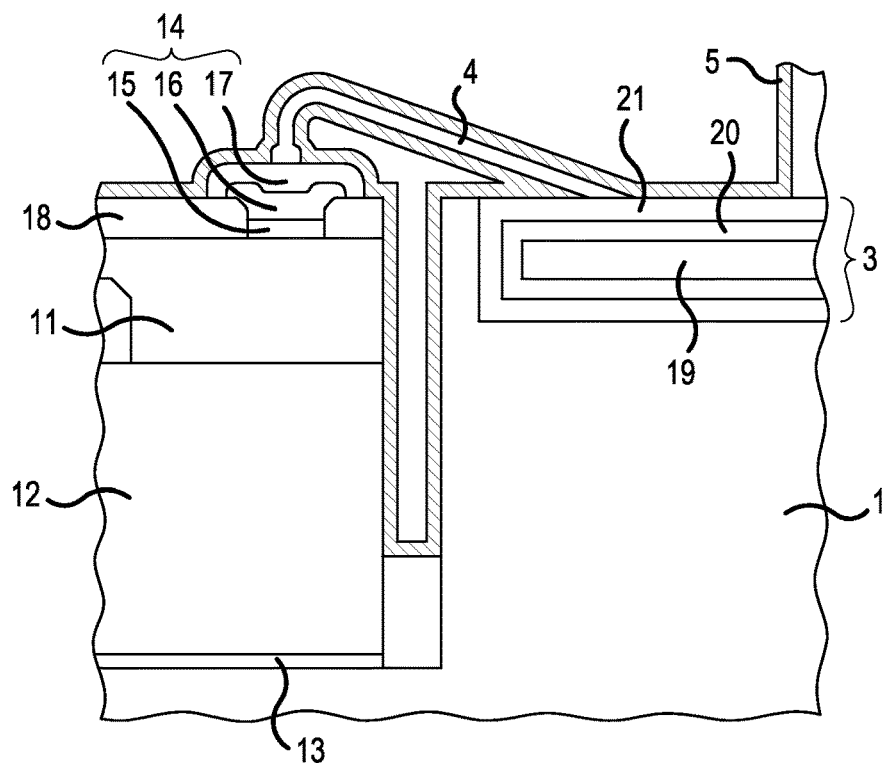
FIG. 1B is another sectional view illustrating the configuration of the pressure sensor device according to the first embodiment.
Figure 2:
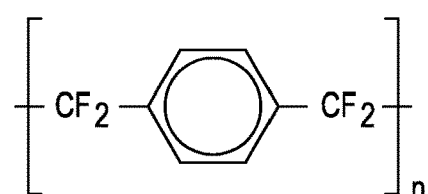
FIG. 2 is a chemical formula illustrating a recurring unit of a molecular structure for a protective film shown in FIGS. 1A and 1B.

A configuration of a pressure sensor device according to the first embodiment will be described. FIGS. 1A and 1B are sectional views illustrating the configuration of the pressure sensor device according to the first embodiment. FIG. 1A shows a whole figure, and FIG. 1B shows an enlarged sectional view of an essential part thereof. FIG. 2 is a chemical formula illustrating a recurring unit of a molecular structure for a protective film shown in FIGS. 1A and 1B. The pressure sensor device described in FIGS. 1A and 1B has the configuration that a sensor unit 10 is stored in a recessed sensor mount portion 2 formed in a resin case 1. The resin case 1 may be formed from resin molded members having high mechanical strength such as poly(phenylene sulfide) (PPS), poly(vinylene terephthalate) (PBT), and poly (acetate) (POM), for example. The sensor unit 10 is formed so that a semiconductor pressure sensor chip 11 is joined to one side of a glass pedestal 12, and the other side of the glass pedestal 12 is die-bonded through an adhesive 13 to the bottom portion of the sensor mount portion 2.

The semiconductor pressure sensor chip 11 comprises a pressure gauge section (diaphragm) 11a composed of a central portion, which is processed thinner in thickness than a peripheral portion and then will be bent when pressure is applied, a resistance bridge (not shown) formed in the pressure gauge section 11a, and a circuit section which amplifies and corrects an output of the resistance bridge. The resistance bridge is formed by connecting a plurality of semiconductor strain gauges made of material having piezo-resistance effect in a bridge circuit. An electrode pad 14 on the semiconductor pressure sensor chip 11 has a configuration that a gold (Au) electrode 17 is formed on an aluminum (Al) electrode 15 through an adhesive properties secureness and diffusion prevention layer 16. The adhesive properties secureness and diffusion prevention layer 16 such as titanium tungsten (TiW), titanium nitride (TiN), and nickel (Ni) can be provided by sputtering, vapor deposition, or plating. Further, the adhesive properties secureness and diffusion prevention layer 16 may be a laminated film including an adhesive properties secureness layer and a diffusion prevention layer.

The electrode pad 14 is not limited to the configuration as described above but may be also configured by the aluminum electrode 15 only. The surface of the semiconductor pressure sensor chip 11 except the electrode pad 14 is encapsulated with a silicon nitride film 18. The electrode pad 14 is electrically connected through a bonding wire 4 to a lead terminal (lead frame) 3 for leading externally that pierces through the resin case 1 and is integrally insert-molded therein. The glass pedestal 12 is made of heat-resistant glasses such as Pyrex (R) and the like. The lead terminal 3 is formed so that nickel plating 20 and gold plating 21 are applied to a base material 19 composed of phosphor bronze, for example. Either nickel plating 20 or gold plating 21 may be also performed thereto. The bonding wire 4 is made of aluminum or gold.

An entire surface of the sensor unit 10, an exposed part of the lead terminal 3 internally-located in the resin case 1, the bonding wire 4, and an exposed part of an inner wall 1a of the resin case 1 is coated with the protective film 5. And then the entire surface is protected from contact with the pressure medium to be measured and from adhesion of contaminant or the like included in the pressure medium to be measured. The exposed part of the inner wall 1a of the resin case 1 corresponds to an inner wall portion, which does not contact the sensor unit 10 and the lead terminal 3, and includes also an inner wall part of a sensor mount portion 2. Namely, the protective film 5 coats not only each constituent part internally-located in the resin case 1 but also an exposed part of the resin part possibly exposed to the pressure medium to be measured. Upon this condition, the pressure medium to be measured contacts the pressure gauge section 11a of the semiconductor pressure sensor chip 11 through the protective film 5, and then pressure will be applied.

The protective film 5 is a polymeric film composed of a poly(p-xylylene) (PPX) family polymer including fluorine and has a molecular structure that two fluorocarbon groups are bound to a benzene ring, for example, as shown in FIG. 2. Concretely, the protective film 5 may be a poly(p-xylylene) polymer film having a molecular structure that two difluoromethylene ($CF_2$) groups or the like are bound to a benzene ring, for example. More concretely, the protective film 5 may be formed by chemical vapor deposition (CVD) from the diX-SF, which is a poly(p-xylylene) resin coating (diX (R):di(p-xylylene) conformal coating) provided by KISCO LTD. (R).

Next, a method for manufacturing the pressure sensor device according to the first embodiment will be described. Firstly, the sensor unit 10, in which the semiconductor pressure sensor chip 11 is electrostatically joined to the glass pedestal 12, is die-bonded to the bottom portion of the sensor mount portion 2 through the adhesive 13. Next, the lead terminal 3 for leading externally that pierces through the resin case 1 and is integrally insert-molded therein is connected to the electrode pad 14 formed on the semiconductor pressure sensor chip 11 through the bonding wire 4. Next, for example, the resin case 1 in which the sensor unit 10 is mounted is inserted into a vapor deposition chamber of coating equipment (not shown) including a vaporization furnace, a decomposition furnace, and the vapor deposition chamber.

Next, for example, the vaporization furnace in which diX-dimers are injected as material constituting the protective film 5 is heated (for example, equal to or less than 180° C.) under reduced-pressure atmosphere, and then the diX-dimers are vaporized to generate gaseous diX-dimers. Next, the gaseous diX-dimers are decomposed in the decomposition furnace at a temperature of 600 to 700° C., for example, to generate gaseous monomers. And then, making the gaseous monomers, which are introduced into the vapor deposition chamber at normal temperature (for example, 25 to 35° C.) under reduced-pressure atmosphere (for example, equal to or less than 50 mTorr), contact the inside of the resin case 1 (vapor deposition) causes the monomers to polymerize, forming the protective film 5.

In the vapor deposition chamber at normal temperature under reduced-pressure atmosphere when forming the protective film 5, a polymer molecule providing gaseous monomers is in a state of thermally kinetic condition. Then the polymer molecule can migrate into also gaps between each of the resin case 1 and the sensor mount portion 2 and each of the sensor unit 10, the lead terminal 3, and the bonding wire 4. This allows the protective film 5 to coat the entire surface of the sensor unit 10, the exposed part of the lead terminal 3 internally-located in the resin case 1, the bonding wire 4, and the exposed part of the inner wall 1a of the resin case 1, completing the pressure sensor device shown in FIGS. 1A and 1B.

A thickness variation of the protective film 5 formed by the method described above is around ±10% of the protective film 5 thickness, and then the uniformity of the protective film 5 can be ensured in comparison with the case for using a liquid resin, as confirmed by the present inventor. Then, this allows an offset voltage variation to be small for the pressure sensor device and can control a change of measured pressure values depending on temperature characteristics even if sensitivity of the pressure sensor device decreases by forming the protective film 5 on a semiconductor strain gauge (not shown). Further, the film is formed more uniformly in comparison with the case using liquid resin, and then this can suppress things that the bonding wire 4 swings, and eventually the bonding wire 4 disconnects when the sensor device vibrates because of irregularity generated during film formation.

Concretely, when the pressure gauge section 11a having a thickness of 60 μm in the semiconductor pressure sensor chip 11 is formed, and a poly(p-xylylene) polymer film having a thickness of 5 μm is formed as the protective film 5, resulting in a thickness of 5 μm±10% as the protective film 5 on the pressure gauge section 11a, it is confirmed that in comparison with the case of eliminating the formation of the protective film 5, there are a shift of approximately 5% in sensitivity level lowering, a fluctuation equal to or less than 0.5% of full scale against a measured pressure range in offset voltage variation, and a fluctuation of approximately 1% of full scale in total accuracy including a variation depending on temperature characteristics. These fluctuations caused by the formation of the protective film 5 can be controlled by trimming the pressure sensor characteristics using a general method after forming the protective film 5. For example, a trimming permits the accuracy to become in the range of ±1% of full scale under operating circumstances in the temperature range of 25 to 85° C. and in the range of ±2% of full scale under operating circumstances at a low temperature of around −30° C. and at a high temperature of around 130° C.

Further, if a thickness of the pressure gauge section 11a of the semiconductor sensor chip 11 is reduced to equal to or less than 30 μm in order to increase the sensitivity of the pressure sensor, film formation may be eliminated selectively on the pressure gauge section 11a in order to control an influence on the characteristics for the pressure sensor because a poly(p-xylylene) polymer film may be formed so as to be 5 μm in thickness as the protective film 5 after a mask is formed selectively on the pressure gauge section 11a. This is the reason why corrosion of the semiconductor pressure sensor chip 11 is originated from the corrosion of the electrode pad 14 connected to the bonding wire 4. Coating the connection part between the electrode pad 14 and the bonding wire 4 with the protective film 5 can suppress the corrosion of the electrode pad 4, resulting in suppressing the corrosion of the semiconductor pressure sensor chip 11.

Figure 3:
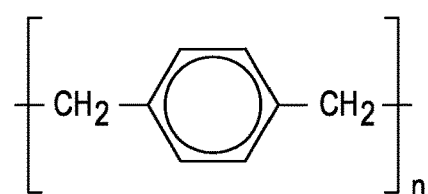
FIG. 3 is a chemical formula illustrating a recurring unit of a molecular structure for a protective film of a comparative example.

Next, the protective film 5 composed of the poly(p-xylylene) polymer having the molecular structure shown in FIG. 2 is immersed into a mixed acid solution for 24 hours at 80° C. in temperature, and then acid resistance of the protective film 5 is verified by the presence or absence of the dissolution thereof (hereinafter, the first example). In comparison with the first example, a normal poly(p-xylylene) polymer film having a molecular structure in which two methylene ($CH_2$) groups are bound to a benzene ring as shown in FIG. 3 is also immersed into the mixed acid solution having the same condition to the protective film 5, and then the presence or absence of the dissolution thereof is verified (hereinafter, the first comparative example). FIG. 3 is the chemical formula illustrating the recurring unit of the molecular structure for the protective film of the comparative example. Four kinds of mixed acid solutions, which are different from each other about its ingredient and the content, are prepared as the mixed acid solutions immersing the first example and the first comparative example (hereinafter, the first to the fourth mixed acid solutions).

The first mixed acid solution is prepared so that a 5% volume of hydrofluoric acid (HF) and a 70% volume of nitric acid ($HNO_3$) are diluted with a 25% volume of water ($H_2O$). The second mixed acid solution is prepared so that a 10% volume of hydrofluoric acid (HF), a 15% volume of sulfuric acid ($H_2SO_4$), and a 55% volume of nitric acid ($HNO_3$) are diluted with a 20% volume of water ($H_2O$). The third mixed acid solution is prepared so that a 5% volume of hydrofluoric acid (HF), a 2% volume of hydrochloric acid (HCl), a 1% volume of sulfuric acid ($H_2SO_4$), and a 70% volume of nitric acid ($HNO_3$) are diluted with a 22% volume of water ($H_2O$). The fourth mixed acid solution is prepared so that a 45% volume of sulfuric acid ($H_2SO_4$) and a 10% volume of nitric acid ($HNO_3$) are diluted with a 45% volume of water ($H_2O$). As a result obtained by immersing the first example and the first comparable example into each of the first to the fourth mixed acid solutions, it is confirmed that the first comparative example has been dissolved in all of the first to the fourth mixed acid solutions, and the first example, on the other hand, has not been dissolved in any one of the first to the fourth mixed acid solutions.

Next, in accordance with the method for manufacturing described above, the pressure sensor device, in which the protective film 5 composed of the poly(p-xylylene) polymer is formed on the entire surface of the sensor unit 10, the exposed part of the lead terminal 3 internally-located in the resin case 1, the bonding wire 4, and the exposed part of the inside wall 1a of the resin case 1, is fabricated (hereinafter, the second example), and then the pressure sensor device is immersed into the first to the fourth mixed acid solutions having a temperature of 80° C. and left in the state. Thus it is verified about the presence or absence of the dissolution thereof. The protective film 5 is set to 5 μm±10% in thickness. In comparison with the second example, a pressure sensor device eliminating the protective film 5 is fabricated (hereinafter, the second comparative example) and immersed into the first to the fourth mixed acid solutions at the same condition to the second example.

As a result, in the second comparative example, corrosion has occurred within 48 hours at the sensor unit, the lead terminal, the bonding wire, and the exposed part of the inner wall of the resin case. On the contrary, in the second example, it is confirmed that even after 280 hours, no corrosion has occurred at the sensor unit 10, the exposed part of lead terminal 3 internally-located in the resin case 1, the bonding wire 4, and the exposed part of the inner wall 1a of the resin case 1. Then, it is confirmed that the second example has durable life equal to or more than 5.8 times longer than the second comparable example.

As described above, according to the first embodiment, coating the entire surface of each constituent part internally-located in the resin case and the exposed part of the inside wall of the resin case with the protective film composed of the poly(p-xylylene)-family polymer including fluorine can prevent each constituent part internally-located in the resin case and the inside wall of the resin case from contacting the pressure medium to be measured. The protective film composed of the poly(p-xylylene)-family polymer including fluorine has water-repellency and acid resistance. Then this can protect each constituent part internally-located in the resin case and the exposed part of the inside wall of the resin case against steam and acid vapor included in the pressure medium to be measured, wherein the steam and the acid vapor cannot be prevented by a conventional gel protective member composed of fluoro-gel. This prevents each constituent part internally-located in the resin case and the inside wall of the resin case from corroding. Then this can provide a highly reliable pressure sensor device.

Further, according to the first embodiment, forming the protective film composed of the poly(p-xylylene)-family polymer including fluorine by vapor deposition allows polymer molecules to migrate into gaps between the inner wall of the resin case (including the inner wall of the sensor mount portion) and each of the sensor unit, the lead terminal, and the bonding wire. Then, this allows the protective film to coat each constituent part internally-located in the resin case and the exposed part of the inside wall of the resin case without leaving any space. And then this can protect each constituent part internally-located in the resin case and the inside wall of the resin case against the steam and the acid vapor included in the pressure medium to be measured. Therefore, this can provide a highly reliable pressure sensor device.

Second Embodiment

Figure 4:
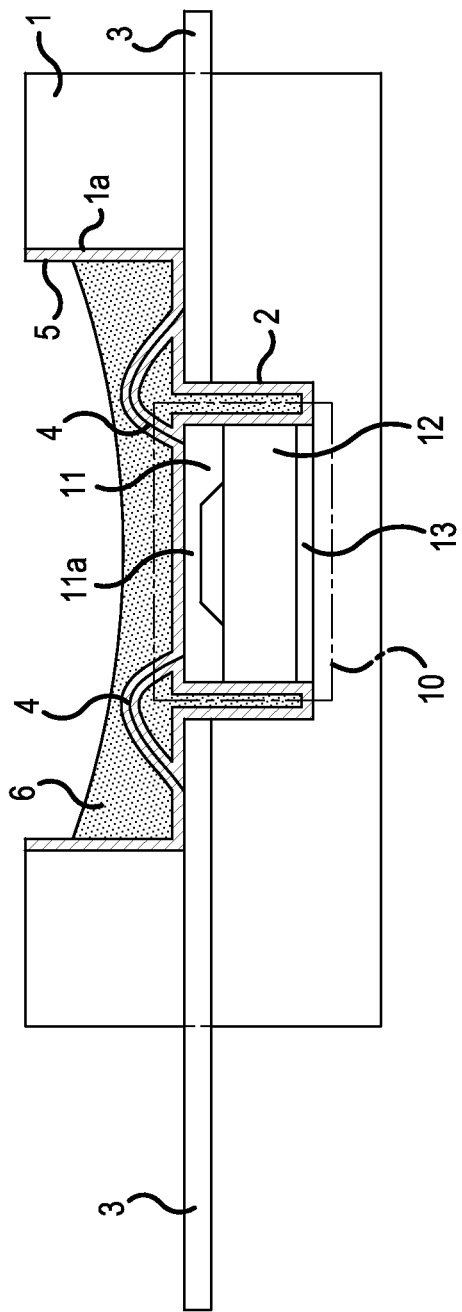
FIG. 4 is a sectional view illustrating a configuration of a pressure sensor device according to a second embodiment.
Figure 5:
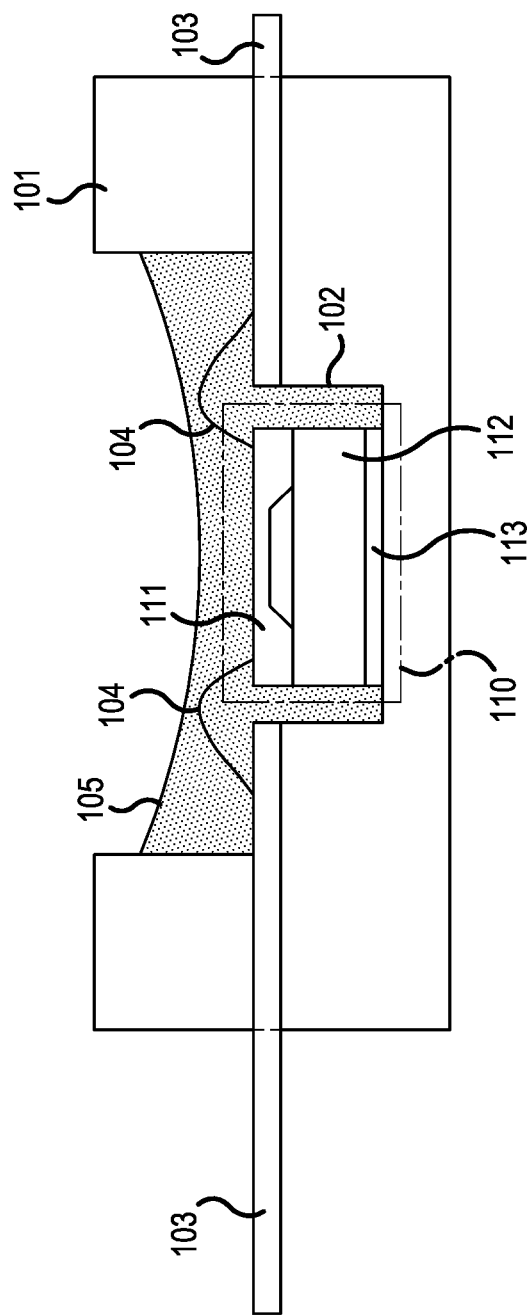
FIG. 5 is a sectional view illustrating a configuration of a conventional pressure sensor device.

Next, a pressure sensor device according to the second embodiment will be described. FIG. 4 is a sectional view illustrating a configuration of the pressure sensor device according to the second embodiment. The pressure sensor device according to the second embodiment differs from the pressure sensor device according to the first embodiment in that a gel protective member 6 is filled up internally in the resin case 1. Namely, the sensor unit 10, the exposed part of the lead terminal 3 internally-located in the resin case 1, the bonding wire 4, and the exposed part of the inner wall 1a of the resin case 1, which are coated with the protective film 5, are further coated with the gel protective member 6.

Concretely, the gel protective member 6 composed of a potting agent such as a silicone gel or the like is filled up internally in the resin case 1. Then, the sensor unit 10, the exposed part of the lead terminal 3 internally-located in the resin case 1, the bonding wire 4, and the exposed part of the inner wall 1a of the resin case 1, which are coated with the protective film 5, are buried in the gel protective member 6. The gel protective member 6 can prevent mechanical and physical damage and breakage such as the bonding wire 4 disconnection caused by contacting manufacturing equipment in manufacturing process and the damage that the semiconductor pressure sensor chip 11 suffers from foreign matter incoming during actual use after mounted on vehicle.

The gel protective member 6 may be a fluorinated gel having water-repellency. Concretely, the gel protective member 6 may be a liquid fluororesin elastomer (SHIN-ETSU SIFEL (R)), which is provided by Shin-Etsu Chemical Co., Ltd. Applying the gel protective member 6 composed of the fluorinated gel can control responsiveness deterioration and sensitivity characteristics fluctuation for the pressure sensor device, wherein the responsiveness deterioration and the sensitivity characteristics fluctuation are caused by soot and water in exhaust gas that deposit, coagulate, and stick on the semiconductor pressure sensor chip 11 during actual use after mounted on vehicle.

As described above, according to the second embodiment, it is possible to obtain a result similar to the first embodiment.

Further, according to the second embodiment, after the protective film 5 is formed, irradiating $O_2$ plasma and $N_2$ plasma on a surface thereof to modify the surface allows wettability to the gel protective member 6 to improve. And then it may be performed to fill with the gel protective member 6. This allows adhesive properties to improve between the surface of the protective film 5 composed of the poly(p-xylylene)-family polymer including fluorine having excellent water-repellency and the gel protective member 6 composed of the fluorinated gel.

According to the forgoing description, the present invention is changeable variously. According to each of the embodiments described above, for example, dimension of each part and constituent materials such as a resin case, a lead terminal, and a bonding wire are variously set in response to requested specifications and the like.

As described above, the pressure sensor device and the method for manufacturing the pressure sensor device according to the present invention is useful for a pressure sensor device employed under circumstances that steam and corrosive gases such as automobile exhaust gases are excessive.

What is claimed is:
1. A pressure sensor device, comprising:
  a sensor chip for converting pressure acting thereon into an electric signal;
  a resin case for storing the sensor chip;
  a lead terminal for taking out externally the electric signal output from the sensor chip, wherein one end of the lead terminal is exposed internally in the resin case and connected to the sensor chip through a wire;
  a protective film composed of a poly(p-xylylene)-family polymer including fluorine, wherein the protective film coats an electrode pad of the sensor chip, an exposed part of the lead terminal internally-located in the resin case, the wire, and at least a portion of an inner wall of the resin case; and a protective member, composed of a fluorinated gel, disposed on the protective film.

2. The pressure sensor device according to claim 1, wherein the protective film coats an entire surface of the sensor chip and an exposed part of the inner wall of the resin case.

3. The pressure sensor device according to claim 1, wherein the protective member is filled up internally in the resin case, and wherein the sensor chip, the exposed part of the lead terminal internally-located in the resin case, and the wire are buried in the protective member.

4. The pressure sensor device according to claim 1, wherein the sensor chip is a semiconductor sensor chip.

\* \* \* \* \*